United States Patent
Shimomura et al.

(10) Patent No.: US 6,527,966 B1
(45) Date of Patent: Mar. 4, 2003

(54) PATTERN FORMING METHOD

(75) Inventors: Koji Shimomura, Takatsuki (JP); Yoshiaki Kinoshita, Shizuoka (JP); Satoru Funato, Shizuoka (JP); Yuko Yamaguchi, Isehara (JP)

(73) Assignees: Clariant Finance (BVI) Limited, Tortola (VG); Matsushita Electric Industrial Co., Limited, Osaka (JP)

( * ) Notice: Subject to any disclaimer, the term of this patent is extended or adjusted under 35 U.S.C. 154(b) by 0 days.

(21) Appl. No.: 09/445,346
(22) PCT Filed: Apr. 5, 1999
(86) PCT No.: PCT/JP99/01792
§ 371 (c)(1),
(2), (4) Date: May 1, 2000
(87) PCT Pub. No.: WO99/53378
PCT Pub. Date: Oct. 21, 1999

(30) Foreign Application Priority Data

Apr. 8, 1998 (JP) .......................................... 10-095681

(51) Int. Cl.[7] .................................................. B44C 1/22
(52) U.S. Cl. ........................... 216/41; 216/58; 216/67; 216/99; 438/704; 438/706; 438/717; 438/753; 430/270.1; 430/271.1
(58) Field of Search .............................. 216/41, 51, 58, 216/63, 67, 83, 99; 438/704, 706, 710, 717, 745, 753; 430/270.1, 271.1, 914, 921; 522/31, 17, 59

(56) References Cited

U.S. PATENT DOCUMENTS

| 5,332,648 A | 7/1994 | Kihara et al. ............... 430/270 |
| 5,558,971 A | 9/1996 | Urano et al. ............... 430/170 |
| 5,558,976 A | 9/1996 | Urano et al. ............... 430/326 |
| 5,624,787 A | 4/1997 | Watanabe et al. ......... 430/270.1 |
| 5,663,035 A * | 9/1997 | Masuda et al. ........... 430/270.1 |
| 5,985,512 A * | 11/1999 | Hatakeyama et al. .... 430/270.1 |
| 6,001,538 A * | 12/1999 | Chen et al. .................. 430/316 |
| 6,013,582 A * | 1/2000 | Ionov et al. ................ 438/738 |
| 6,103,447 A * | 8/2000 | Chen et al. .............. 430/270.1 |
| 6,159,652 A * | 12/2000 | Sato et al. ................ 430/270.1 |
| 6,187,688 B1 * | 2/2001 | Ohkuni et al. ............... 438/725 |
| 6,268,436 B1 * | 7/2001 | Chen et al. .................. 525/197 |
| 6,300,035 B1 * | 10/2001 | Thackeray et al. ....... 430/270.1 |
| 6,322,949 B2 * | 11/2001 | Suwa et al. .............. 430/270.1 |

OTHER PUBLICATIONS

Abstract for Japan Patent No. 9298183, May 1998.
Abstract for Japan Patent No. 7226396, Aug. 1996.
Abstract for Japan Patent No. 6333817, Aug. 1995.

* cited by examiner

Primary Examiner—Randy Gulakowski
Assistant Examiner—Jiri F. Smetana
(74) Attorney, Agent, or Firm—Sangya Jain (57) ABSTRACT

A method of forming a pattern in which production of reaction products in the interface between an organic anti-reflective coating and a radiation sensitive material coating is suppressed, the number of residues of an etchable layer formed after etching is decreased, and which provides a etched pattern having high resolution and good dimensional accuracy. According to the method, an etchable layer (11) composed of polysilicon coating an organic anti-reflective coating (12), and a radiation sensitive material coating (13) composed of a chemically amplified resist material containing as acid generators both (a) onium salt compound and (b) at least one of a sulfone compound and a sulfonate compound are formed on a semiconductor substrate (10), the radiation sensitive material coating (13) is imagewise exposed through the mask (14) and developed to form a patterned radiation sensitive material coating (13b). Thereafter, preferably the anti-reflective coating is etched using a mixture gas of $SO_2$ and $O_2$, further the etchable layer is dry-etched to form a pattern of the etchable layer.

5 Claims, 2 Drawing Sheets

PATTERN FORMING METHOD

TECHNICAL FIELD

This invention relates to a method of forming a pattern and, more particularly, it relates to a method of forming a pattern composed of an etchable layer by conducting dry etching of an etchable layer formed on a substrate for semiconductor through a mask of patterned radiation sensitive material coating formed on the etchable layer, with an anti-reflective coating composed of an organic material being intervened therebetween.

BACKGROUND ART

With continuous miniaturization of a system using complicated semiconductor integrated circuits, much finer patterns of semiconductor circuits have been formed. With the progress of such miniaturization, it has become extremely difficult to create complicated circuits on a small size chip according to the pattern lithography method using a patterned radiation sensitive material coating as a mask. One of the reasons for the difficulty is that, since energy beams with shorter wavelength are used for exposure which can be reflected by the substrate or the etchable layer, the energy beams having traveled through the radiation sensitive material coating are reflected in non-uniform directions due to non-uniform step difference on the substrate or on the etchable layer, thus the radiation sensitive material coating being exposed in areas not intended to be exposed. This results in generation of a number of defects and dimensional fluctuation in patterns formed by the lithography method. As one approach to solve this problem, it has been proposed to provide under the radiation sensitive material coating an organic anti-reflective coating which can absorb the energy beams having passed through the radiation sensitive material coating and thus prevents the energy beams from being reflected in non-uniform directions after the energy beams having passed through the radiation sensitive material coating.

A conventional pattern-forming method using this anti-reflective coating will be described below by reference to FIGS. 3(a) and 3(b).

Figure 3A:
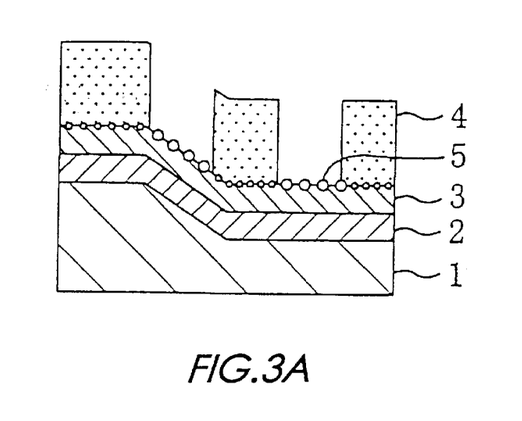
FIG. 3 is a sectional view showing the problematical points in the method of forming a pattern according to the conventional method.

First, as is shown in FIG. 3(a), an anti-reflective coating 3 composed of an organic material and capable of absorbing energy beams is formed on an etchable layer 2 deposited on a semiconductor substrate 1, and a radiation sensitive material coating is further formed on said anti-reflective coating 3. Then, the radiation sensitive material coating is exposed with energy beam through a mask, and exposed or non-exposed areas of the radiation sensitive material coating are removed with a developer to thereby form a patterned radiation sensitive material coating 4 composed of the non-exposed or exposed areas thereof. Subsequently, the anti-reflective coating 3 is dry-etched using the patterned radiation sensitive material coating 4 as a mask to remove those areas of the anti-reflective coating 3 which correspond to the openings of the patterned radiation sensitive material coating 4. Further, the etchable layer 2 is dry-etched using the patterned radiation sensitive material coating 4 as a mask, followed by removing the anti-reflective coating 3 and the radiation sensitive material coating 4 to obtain a pattern 2A composed of the etchable layer 2 on the semiconductor substrate 1, as shown in FIG. 3(b). The thus formed anti-reflective coating 3 absorbs energy beam having traveled through the radiation sensitive material coating 4 and thus serves to prevent non-uniform reflection even in the presence of stepped areas on the semiconductor substrate 1 or the etchable layer 2 and prevent exposure of areas not intended to be exposed, thus the etchable layer having the pattern 2A with good dimensional accuracy being formed.

Recently, chemically amplified resists have often been used as the radiation sensitive material coatings. However, it has been found that, in the case of using the chemically amplified resists as the material of the radiation sensitive material coating and providing it on the anti-reflective coating, reaction products 5 are formed in the interface between the anti-reflective coating 3 and the radiation sensitive material coating 4. When the radiation sensitive material coating 4 and the anti-reflective coating 3 are developed or etched under the ordinary condition, reaction products 5 can not be removed but remain on the etchable layer 2. If the etchable layer 2 is dry-etched with the reaction products remaining, the reaction products 5 act as an etching mask, and there arises the problem that, as is shown in FIG. 3(b), residues 6 of the etchable layer 2 are formed in those areas which are intended to be etched away (space areas) or that side walls 2a of the etchable layer 2 which are demanded to be vertical have a non-uniform profile. The residues 6 will be equally formed regardless of the pattern opening ratio of the radiation sensitive material coating 4, that is, regardless of density of the pattern. Therefore, residues 6 can be formed in a space between patterns in an area crowded with patterns.

As a method for removing the reaction products 5 formed in the interface between this anti-reflective coating 3 and the radiation sensitive material coating 4, it may be considered to conduct dry etching under the condition for removing the reaction product. However, a method of removing the reaction product 5 together with the anti-reflective coating 3 by dry etching is not effective as a method of forming a pattern in the etchable layer because of the following reason. That is, removal of the reaction products 5 requires stronger etching conditions than in the case of removing the anti-reflective coating 3. Hence, when enough strong etching conditions to remove the reaction products are selected, the patterned radiation sensitive material coating 4 having about the same etching properties will be simultaneously etched away, thus resist pattern with good dimensional accuracy not remaining. Therefore, the patterned radiation sensitive material coating 4 can not function as a mask. On the other hand, if dry etching of the anti-reflective coating 3 is conducted under such condition that etching of the patterned radiation sensitive material coating 4 is minimized, reaction products 5 and the anti-reflective coating 3 will be remained a lot on the etchable layer 2. Further, a dry etching process involving formation of a deposit on the side wall of anti-reflective coating 3 so as to improve dimension-controlling properties for the anti-reflective coating 3 would be liable to cause adhesion of the deposit coming off from the side wall of the anti-reflective coating 3 onto the etchable layer 2, and the deposit would in turn function as a mask to form residues 6 composed of the etchable layer.

Problems to be caused when residues 6 composed of the etchable layer 2 and formed on semiconductor substrate 1 exist or when pattern side walls 2a of the etchable layer 2 have a non-uniform profile are described in more detail by reference to FIG. 4.

Figure 3B:
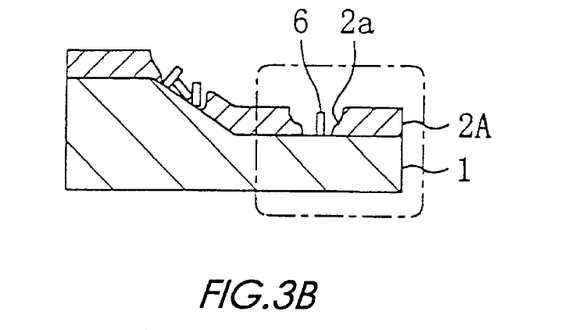
Figure 4:
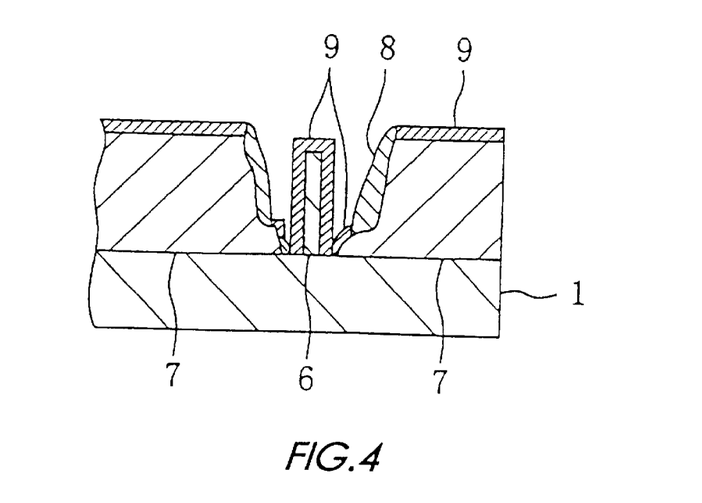
FIG. 4 is a sectional view of the patterned etchable layer formed according to the conventional method of forming patterns.

FIG. 4 is an enlarged view of the area surrounded by one-dot chain line in FIG. 3(b). As is shown in FIG. 4, gate electrodes 7 composed of polysilicon layer, i.e., the etchable layer, are formed on semiconductor substrate 1, and residues 6 of polysilicon layer remain in the region between the gate electrodes 7 on the semiconductor substrate 1, i.e., source drain region. Side walls 8 of an insulating material such as $Si_3N_4$, TEOS or HTO are formed on the side of gate electrodes 7. In order to reduce resistance of resulting integrated circuit elements, surfaces of the gate electrodes 7 and the source drain areas are silicidated with $TiSi_2$ or the like to form a silicide layer 9 covering the surfaces. However, since side profiles of the gate electrodes 7 are non-uniform, gate electrodes 7 are partly bared from the side wall 8. The silicide layer 9 is formed both on the bared area of the gate electrodes 7 and on the surface of polysilicon residues 6. As a result, the gate electrodes 7 and the source drain areas are electrically connected to each other through the silicide layer 9 on the surface of electrodes 7 or the silicide layer 9 on the surface of polysilicon residues 6, thus an abnormal leakage current flowing between the gate electrodes 7 and the source drain areas.

As is described above, when an etchable layer 2 made of a conductive material such as polysilicon is used, there arises the problem that wiring patterns formed on the same conductive layer are electrically conducted to each other through conductive residues 6 or, further, a conductive layer formed on the semiconductor substrate 1 and a wiring pattern formed on the conductive layer with an interlayer insulating coating therebetween are electrically connected to each other through the conductive residues 6 to cause electric leakage between wiring patterns or between the conductive layer and the wiring pattern, thus performance of a device using the semiconductor integrated circuits being deteriorated or yield of the device being reduced.

On the other hand, as chemically amplified resist compositions, there are at present known those which contain (a) an organic material having a substituent or substituents capable of being released in the presence of an acid and (b) a compound composed of an onium salt compound capable of generating an acid by exposure with radiation (acid generator). Onium salt compounds have such a strong ability of suppressing dissolution of resist that unexposed portions of the radiation sensitive material show a smaller dissolution properties for a developer, though they generates a comparatively strong acid upon being exposed. Therefore the chemically amplified resist containing an onium salt compound can provide resist images with good dimensional accuracy and high resolution. On the other hand, it has defects that it is liable to form standing wave on resist patterns and, under some process atmosphere, generate an insoluble layer on the surface of the resist layer which form an overhung profile of the resist pattern, called T-top. Hence, in the case of forming resist patterns using the chemically amplified resists containing onium salt compounds and then etching the etchable layer, there have sometimes resulted patterns with undesired line width and profile.

An object of the present invention is to provide a method of forming a pattern not having the above-described defects.

That is, a first object of the present invention is to provide a method of forming a pattern, which prevents formation of reaction products in the interface between an anti-reflective coating and a radiation sensitive material coating in spite of the presence of the anti-reflective coating composed of organic materials between an etchable layer and a radiation sensitive material coating, thus reducing the number of residues composed of the etchable layer.

A second object of the present invention is to provide a method of forming a high-quality pattern of the etchable layer, which provides a resist image having good dimensional accuracy and high resolution without forming standing wave and T-top.

The other object of the present invention is to provide a method of forming a pattern containing a reduced number of residues composed of the etchable layer, which, even when reaction products are formed in the interface between the anti-reflective coating and the radiation sensitive material coating, removes the reaction products together with the anti-reflective coating upon etching the anti-reflective coating without adversely affecting the patterned radiation sensitive material coating.

DISCLOSURE OF THE INVENTION

In the course of intensive investigation to solve the above-described problems, the inventors have found that the reaction products are generated in the interface between the anti-reflective coating and the radiation sensitive material coating according to the following mechanism.

That is, the anti-reflective coating and the radiation sensitive material coating, which are made of organic materials, generate radicals within them when the radiation sensitive material coating is exposed to light such as UV rays or deep UV rays, electron beams or X-rays, and the radicals in turn react with each other in the interface of the anti-reflective coating and the radiation sensitive material coating to produce aromatic reaction products. It has been found that, particularly when an onium type acid generator is contained in the radiation sensitive material coating, the aromatic reaction products are generated in more amount in the interface between the anti-reflective coating and the radiation sensitive material coating.

As a result of various investigation to develop a method of forming a pattern with less generation of the reaction products and a less number of residues of etchable layer and a method of forming a resist image with good dimensional accuracy and high resolution without forming standing wave and T-tops to thereby form high-quality etched pattern, the inventors have surprisingly found that the above-described problems can all be solved by using a chemically amplified resist material containing an onium salt compound as a material for the radiation sensitive material coating and a sulfone compound or a sulfonate compound as an acid generator. It has further been found that the reaction products can be removed without adversely affecting the radiation sensitive material coating by using a sulfur-containing etching gas as a dry etching material for the anti-reflective coating, thus an etched coating pattern with a less number of residues being formed. The present invention is based on these findings.

That is, a first method of the present invention of forming a pattern comprises:

a first step of forming an anti-reflective coating which is made of organic materials and absorbs energy beams, on an etchable layer which is formed on a substrate for semiconductor;

a second step of forming a radiation sensitive material coating on the anti-reflective coating;

a third step of exposing the radiation sensitive material coating with energy beam and then removing the exposed or non-exposed areas of the radiation sensitive material coating selectively to form a pattern of the radiation sensitive material coating; and a fourth step of dry-etching the etchable layer using as a mask the pattern of the radiation sensitive material coating to form a pattern composed of the etchable layer, wherein the radiation sensitive material coating is made from a chemically amplified resist comprising (a) an organic material containing a substituent or substituents capable of being released in the presence of an acid and (b) compounds generating an acid upon exposure to radiation which comprise at least one of onium salts and at least one selected from among sulfone compounds and sulfonate compounds.

A second method of the present invention of forming a pattern is as described in the first method, wherein said fourth step involves a step of dry-etching the anti-reflective coating with a sulfur-containing etching gas and by using as a mask the pattern of radiation sensitive material coating to form a pattern of the anti-reflective coating and then dry-etching the etchable layer using as a mask the pattern of the radiation sensitive material coating and the anti-reflective coating to form a pattern of the etchable layer.

Figure 1:
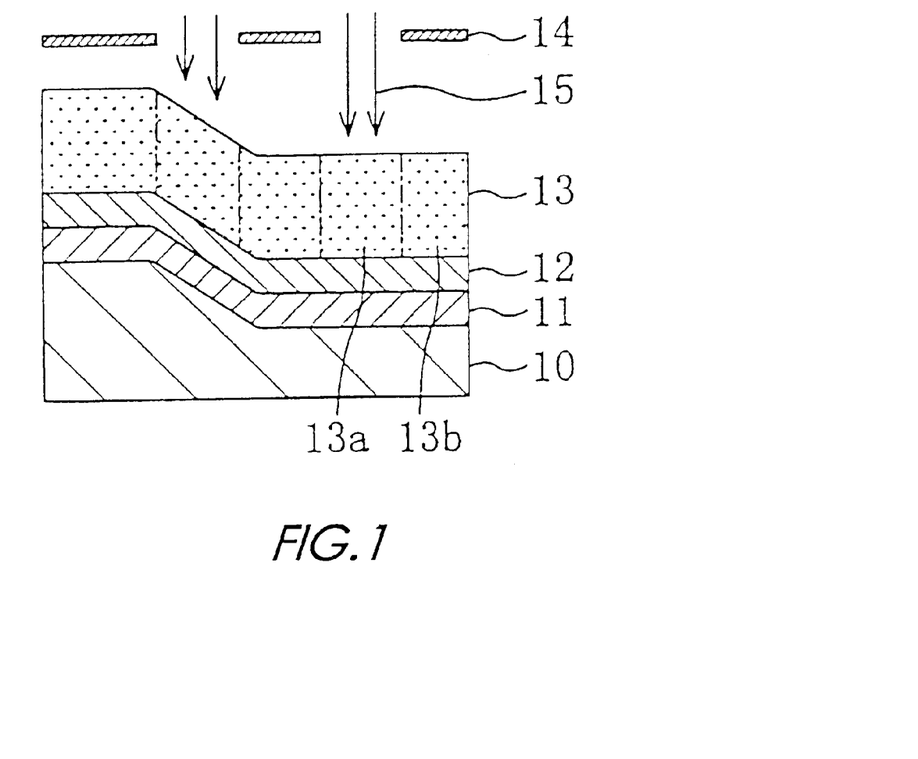
FIG. 1 is a sectional view showing the exposed state of a semiconductor substrate on which the radiation sensitive material coating of the present invention is provided.

Firstly, the first method of the present invention of forming a pattern is specifically described below by reference to FIG. 1. An etchable layer 11, which is composed of, for example, polysilicon is deposited on a semiconductor substrate 10 composed of silicon with an etching stopper such as silicon oxide layer being interposed therebetween, then an anti-reflective coating 12 composed of organic materials and capable of absorbing energy beams such as light (e.g., UV rays or deep UV rays), electron beams or X-rays is applied on the etchable layer 11. Subsequently, a chemically amplified resist material is applied onto this anti-reflective coating 12 to form a radiation sensitive material coating 13 and exposed with energy beam 15 such as light, electron beams or X-rays through a mask 14. After removing exposed areas 13a of the radiation sensitive material coating 13 by dissolving with a developer, the anti-reflective coating 12 is dry-etched through the mask of the thus patterned radiation sensitive material coating 13b to create the pattern in the anti-reflective coating 12. Further, the etchable layer 11 to be etched is dry-etched through the mask of the patterned radiation sensitive material coating to create the pattern in the etchable layer 11. Additionally, as the radiation sensitive material, so-called negative-working radiation sensitive materials in which energy beam-unexposed areas are removed by dissolving with a developer may also be used in place of the so-called positive-working ones in which energy beam-exposed areas are removed by dissolving with a developer. When the patterned radiation sensitive material coating and the anti-reflective coating on the semiconductor substrate 10 are removed after etching the anti-reflective coating, there is obtained a pattern of the etchable layer on the semiconductor substrate 10 as is shown in FIG. 2.

Figure 2:
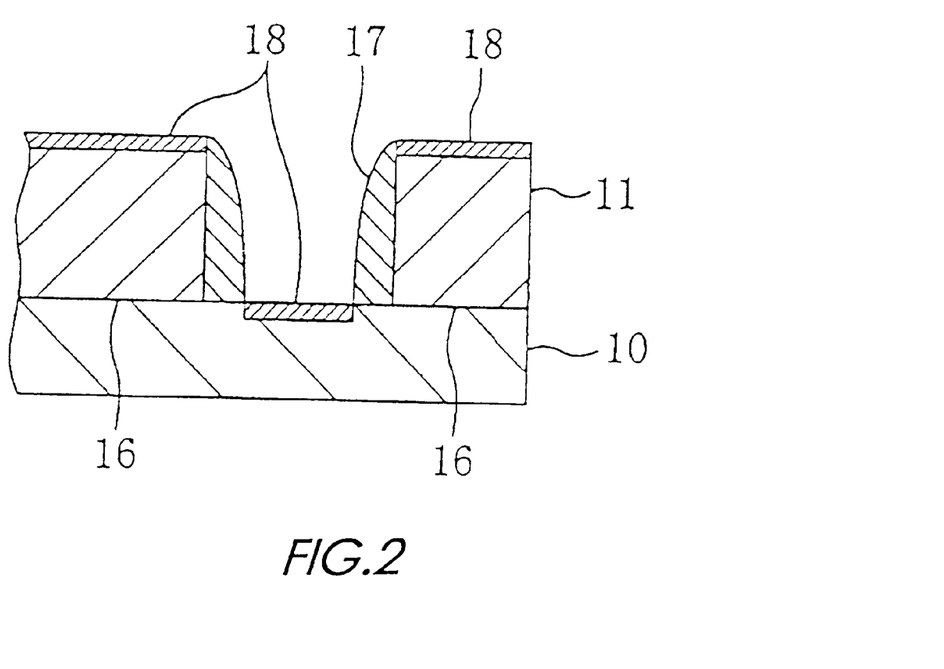
FIG. 2 is an expanded sectional view illustrating the effects of the method of forming a pattern according to the first embodiment of the present invention.

Additionally, in FIG. 2, the surface of gate electrodes 16 composed of the etchable polysilicon layer 11 and the surface of source drain areas between the gate electrodes 16 on the semiconductor substrate 10 are silicidated with $TiSi_2$ or the like to form silicide layer 18 covering the surfaces. On the side surfaces of the gate electrodes 16 were formed side walls 17 composed of an insulating material such as $Si_3N_4$, TEOS or HTO. Since no residues remain on the source drain region and the gate electrodes 16 are not bared from side walls 17 owing to uniformity of the side profiles of the gate electrodes 16, the silicide layer 18 is not formed on the side surface of the gate electrode 16. Therefore, the gate electrodes 16 and the source drain regions are not electrically connected to each other through the silicide layer on the surface of the gate electrode 16 or on the surface of the residues, and no abnormal leakage occurs between the gate electrodes 16 and the source drain regions, thus deterioration of element performance being avoided.

On the other hand, in the first invention, the radiation sensitive material coating comprises a chemically amplified resist material containing (a) an organic compound containing a substituent or substituents capable of being released in the presence of an acid and (b) compounds capable of generating an acid upon exposure to radiation which comprise both at least one of onium salt compounds and at least one member selected from the group consisting of sulfone compounds and sulfonate compounds. This chemically amplified resist material may further contain, if necessary, dissolution inhibitors, basic compounds and other conventionally known additives. In order to prepare a uniform solution of the resist material, solvents are used. These components constituting the resist material are specifically described below.

Organic Materials Containing a Substituent or Substituents Capable of being Released in the Presence of an Acid As the organic materials containing a substituent or substituents capable of being released in the presence of an acid, those resins are preferred which are made alkali-insoluble or slightly alkali-soluble (hereinafter referred to as "resins containing acid-decomposable groups") by adding substituents capable of being released in the presence of an acid (hereinafter referred to as "acid-decomposable groups") to alkali-soluble polymers containing functional groups showing affinity for an alkali developer solution such as a phenolic hydroxyl group, a carboxyl group, etc. As the examples of the alkali-soluble polymers for constituting the resins containing acid-decomposable groups, there are illustrated vinyl polymers having the recurring unit shown by the following formula 1 or 2, phenol resins such as novolak resin, and the like. Examples of the polymers containing the recurring unit of the following formula 1 include poly (hydroxystyrene), poly(hydroxy-α-methylstyrene), poly (hydroxymethylstyrene), etc. and examples of the polymers containing the recurring unit of the formula 2 include homopolymers or copolymers of acrylic or methacrylic acid. Examples of the acid-decomposable group to be added include vinyl ether compounds, dialkyl carbonates. Specific examples of the vinyl ether compounds are those compounds which are represented by the following formula 3 and, more specifically, isopropenyl methyl ether, 3, 4-dihydro-2H-pyrane, butanediol-1,4-divinyl ether, ethylene glycol divinyl ether, triethylene glycol divinyl ether, etc. are preferred. Specific examples of the dialkyl carbonate include di-tert-butyl carbonate, etc. The alkali-soluble polymers and the acid-decomposable groups may be used independently or as a combination of two or more.

(1)

wherein $R^1$ represents a hydrogen atom or an alkyl group, $R^2$ represents an alkyl group, and m is 0 or an integer of 1 to 4.

wherein R³ represents a hydrogen atom or an alkyl group.

wherein R⁴, R⁵ and R⁶ each independently represents a hydrogen atom or a straight, branched, cyclic or hetero atom-containing cyclic alkyl group having 1 to 6 carbon atoms, and R⁷ represents a straight, branched, cyclic or hetero atom-containing cyclic alkyl group having 1 to 10 carbon atoms or aralkyl group which may optionally be substituted by a halogen atom, an alkoxyl group, an aralkyloxycarbonyl group or an alkylcarbonylamino group.

Acid generators
(Onium Salt Compounds)

As the onium salt compounds to be used in the present invention as acid generators, any of those which are known to generate acid upon exposure to radiation may be used. For example, there are illustrated sulfonium salt compounds such as triphenylsulfonium methane, etc., iodonium salt compounds such as diphenyliodonium trifluoromethane sulfonate etc., phosphonium salt compounds, diazonium salt compounds, pyridinium salt compounds, etc. Of these onium salt compounds, sulfonium salt compounds and iodonium salt compounds are preferred, with sulfonium salt compounds being particularly preferred. Particularly preferred sulfonium salt compounds and iodonium salt compounds to be used in the present invention are triphenylsulfonium trifl-ate, triphenylsulfonium propionate, triphenylsulfonium hexafurate, and diphenyliodonium triflate.

(Sulfone compounds)

As the sulfone compounds, there are illustrated, for example, β-ketosulfones, β-sulfonylsulfonesand a-diazo compounds thereof. Disulfone compounds are also included. Specific examples of these sulfone compounds are given below:

(i) bissulfonylmethanes such as methylsulfonyl p-toluenesulfonylmethane, bis(phenylsulfonyl)methane, bis(4-methylphenylsulfonyl)methane, bis(3-methylphenylsulfonyl)-methane, bis(4-ethylphenylsulfonyl)methane, bis(2,4-dimethylphenylsulfonyl)methane, bis(4-t-butylphenylsulfonyl)-methane, bis(4-methoxyphenylsulfonyl)methane, bis(4-fluorophenylsulfonyl)methane, bis(4-chlorophenylsulfonyl)-methane, bis(4-bromophenylsulfonyl)methane, biscyclohexylsulfonylmethane, etc.;

(ii) bissulfonyldiazomethanes such as bis(isopropylsulfonyl)-diazomethane, bis(t-butylsulfonyl)diazomethane, bis(sec-butylsulfonyl)diazomethane, bis(cyclopentylsulfonyl)-diazomethane, bis(cyclohexylsulfonyl)diazomethane, cyclohexylsulfonylethylsulfonyldiazomethane, cyclohexylsulfonyl t-butylsulfonyldiazomethane, methylsulfonyl p-toluenesulfonyldiazomethane, bis(phenylsulfonyl) diazomethane, bis(4-methylphenylsulfonyl) diazomethane, bis(3-methylphenylsulfonyl) diazomethane, bis(4-ethylphenylsulfonyl)diazomethane, bis(2,4-dimethylphenyl-sulfonyl) diazomethane, bis(4-t-butylphenylsulfonyl)-diazomethane, bis(4-methoxyphenylsulfonyl)diazomethane, bis(4-fluorophenylsulfonyl)diazomethane, bis(4-chlorophenylsulfonyl)diazomethane, bis(4-bromophenylsulfonyl)-diazomethane, etc.;

(iii) sulfonylcarbonyldiazomethanes such as cyclohexylsulfonylcyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethylbutanone, 1-acetyl-1-(1-methylethylsulfonyl)diazomethane, 1-diazo-1-methylsulfonyl-4-phenyl-2-butanone, p-toluenesulfonylcyclohexylcarbonyl-diazomethane, 1-diazo-1-(4-methylphenylsulfonyl) -3,3-dimethyl-2-butanone, phenylsulfonylphenylcarbonyldiazomethane, 1-diazo-1-phenylsulfonyl-3,3-dimethyl-2-butanone, 1-diazo-4-methylphenylsulfonyl)-3-methyl-2-butanone, 2-diazo-2-(4-methylphenylsulfonyl)cyclohexyl acetate, 2-diazo-2-phenylsulfonyl t-butyl acetate, 2-diazo-2-methylsulfonyl isopropyl acetate, 2-diazo-2-phenylsulfonyl t-butyl acetate, 2-diazo-2-(4-methylphenylsulfonyl) t-butyl acetate, etc.; and (iv) sulfonylcarbonylalkanes such as 2-methyl-2-(4-methylphenylsulfonyl)propiophenone, 2-cyclohexylcarbonyl-2-(4-methylphenylsulfonyl) propane, 2-methanesulfonyl-2-methyl-4-methylthiopropiophenone, 2,4-dimethyl-2-(4-methylphenylsulfonyl)pentan-3-one, etc.

Of these illustrative compounds, particularly preferred compounds are biscyclohexylsulfonyldiazomethane, bisphenylsulfonyldiazomethane, bis(4-chlorophenylsulfonyl)-diazomethane, biscyclohexylsulfonylmethane, bisphenylsulfonylmethane, bis(4-methylphenylsulfonyl)methane, etc.

(Sulfonate Compounds)

As the sulfonate compounds, there are illustrated alkylsulfonates, haloalkylsulfonates, arylsulfonates, iminosulfonates, etc. Examples of the sulfonate compounds are:

(i) nitrobenzyl sulfonates such as 2-nitrobenzyl p-toluenesulfonate, 2,4-dinitrobenzyl p-toluenesulfonate, 2,6-dinitrobenzyl p-toluenesulfonate, 2,6-dinitrobenzyl p-trifluoromethylphenylsulfonate, etc;

(ii) alkyl- or arylsulfonates such as pyrogallol trismethane sulfonate, pyrogallol tristrifluoromethane sulfonate, pyrogallol trisphenyl sulfonate, pyrogallol tris-4-methylphenyl sulfonate, pyrogallol tris-4-methoxyphenyl sulfonate, pyrogallol tris-2,4, 6-trimethylphenyl sulfonate, pyrogallol trisbenzyl sulfonate, similar compounds derived from gallic acid esters, catechol, resorcinol or hydroquinone;

(iii) benzoin sulfonates such as benzointosylate, benzoinmesylate, etc.; and (iv) sulfonic acid esters such as 2,2,2-trifluoro-1-trifluoromethyl-1-(3-vinylphenyl)ethyl 4-chlorobenzene sulfonate, 2,2,2-trifluoro-1-p-tolyl-1-trifluoromethylethyl 4-chlorobenzene sulfonate, 2,2,2-trifluoro-1-p-tolyl-1-trifluoromethylethyl 4-(2-phenoxyethoxy)benzene sulfonate, 2,2,2-trifluoro-1-trifluoromethyl-1-(4-vinylphenyl) ethylnaphthalene-2-sulfonate, 2,2,2-trifluoro-1-phenyl-1-trifluoromethylethylpropane sulfonate, 2,2,2-trifluoro-1-trifluoromethyl-1-(3-vinylphenyl)-ethyl 4-butoxybenzene sulfonate, 2,2,2-trifluoro-1,1-p-tolyl-1-trifluoromethylethyl 3,5-dichlorobenzene sulfonate, 1,3-bis-(2,2,2-trifluoro-1-methanesulfonyloxy-1-trifluoromethylethyl) benzene, 1,4-bis-(2,2,2-trifluoro-1-methanesulfonyloxy-1-trifluoromethylethyl)benzene, etc.

Of these illustrative compounds, pyrogallol trismethanesulfonate, pyrogallol tristrifl-ate, benzoin tosylate, etc. are particularly preferred.

Contents of the above-described onium salt compounds, sulfone compounds and sulfonate compounds in the chemically amplified resist material may be any amounts as long as the objects of the present invention can be attained. In general, however, the onium salt compounds, the sulfone compounds and the sulfonate compounds are used in amounts of 0.5 to 10 parts by weight, 1 to 10 parts by weight and 1 to 10 parts by weight, respectively, based on 100 parts by weight of the organic materials contained in the chemically amplified resist material and having a substituent or substituents capable of being released in the presence of an acid. Mixing ratio of the onium salt compound and the sulfone compound and/or the sulfonate compound is such that 0.1 to 5 parts by weight of the onium salt compound and 0.5 to 10 parts by weight of sum of the sulfone compound and the sulfonate compound is preferably used based on 100 parts by weight of the organic materials having a substituent or substituents capable of being released in the presence of an acid, with 0.5 to 2 parts by weight of the onium salt being more preferable. Additionally, when only, for example, the sulfone compound is used, the phrase "sum of the sulfone compound and the sulfonate compound" means the amount of the compound alone. If the content of the onium salt compound is less than 0.1 part by weight, the combined use of the onium salt compound and the sulfone compound and/or the sulfonate compound fails to provide sufficient effects, for example, dimensional difference between line width of pattern in isolated pattern area and that in dense pattern area becomes great. On the other hand, if the content of the onium salt compound exceeds 5 parts by weight, almost no effects of the combined use are obtained, for example, cross section of the formed pattern gives a T-top profile and becomes taper-like, or when some effects of the combined use are obtained, there result other defects such as formation of scum upon development. If the content of the sulfone compound and the sulfonate compound is less than 0.5 part by weight, almost no effects are obtained by the combined use with the onium salt compound. For example, sufficient effect of suppressing formation of reaction products in the interface between the anti-reflective coating and the radiation sensitive material coating can not be expected to obtain, and serious standing wave is formed. On the other hand, if the content exceeds 10 parts by weight, there result such defects as that dimensional difference between line width of resist pattern in isolated pattern area and that in dense pattern area becomes great, and that cross sectional shape of the formed pattern becomes taper-like. When there are obtained some effects by the combined use of the onium salt compound and the sulfone compound and/or the sulfonate compound, there result other defects such as formation of scum upon development. In the case of using the sulfone compound and the sulfonate compound as a mixture, the mixing ratio (by weight) is preferably 1:0.5 to 1:10. Further, as to the total amount of the acid generators, they are used in an amount of preferably 1 to 10 parts by weight per 100 parts by weight of the organic materials having a substituent or substituents capable of being released in the presence of an acid.

In the present invention, formation of reaction products in the interface between the anti-reflective coating and the radiation sensitive material coating can be suppressed by using the sulfone compound or the sulfonate compound together with the onium salt compound. In addition, when optimum mixing rate of the onium salt and the sulfone compound and/or the sulfonate compound to the organic materials are selected there can be formed a developed pattern with high resolution wherein a strong development-inhibiting effect is obtained in unexposed areas and a high dissolution property for a developer is given to exposed areas.

Dissolution Inhibitor

Dissolution inhibitors are those substances which themselves contain an acid-decomposable protective group, control dissolution properties of the resin having acid-decomposable groups for an alkali developer solution and, after being decomposed in the presence of an acid, accelerate dissolution of the resin having acid-decomposable groups which are also decomposed to render the resin alkali-soluble. Examples thereof include dibutoxycarbonyl-bisphenol A, dibutoxycarbonylbisphenol F, 4-t-butoxycarbonylphenyl, t-butyl cholate, t-butyl deoxycholate, diphenolic acid tert-butyl ester derivatives, tri(hydroxyphenyl)methane derivatives, etc. Typical examples thereof include bis-(4-t-butoxycarbonylmethyloxy-2,5-dimethylphenyl) methyl-4-t-butoxycarbonylmethyloxybenzene, etc.

Basic Compounds

As the basic compounds, any of both radiation responsive basic compounds capable of being decomposed by exposure to radiation and radiation non-responsive basic compounds may be used. Addition of the basic compound serves to suppress deterioration of pattern properties even when processing steps are conducted with various delayed intervals upon formation of the pattern and can prevent diffusion of the acid produced in exposed areas into unexposed areas to thereby prevent reduction of contrast, thus being preferred. The basic compound is added preferably in an amount of 0.05 to 10 parts by weight per 100 parts by weight of the organic materials containing a substituent or substituents capable of being released in the presence of an acid. As the radiation responsive basic compound, sulfonium compounds, iodonium compounds, etc. are preferably used.

Other Additives

As other additives, there are illustrated, for example, surfactants, sensitizers, light absorbents, dyes, pigments, organic carboxylic acids, leveling agents, stabilizers, low molecular weight compounds, plasticizers, etc.

Solvents

As solvents, any one maybe used that can dissolve the components in the chemically amplified resist material to form a uniform radiation sensitive material coating. In general, there are illustrated glycol ethers such as ethyleneglycol monomethyl ether, ethyleneglycol monoethyl ether, and propyleneglycol monomethyl ether; glycol ether acetates such as ethyleneglycol monoethyl ether acetate and propyleneglycol monomethyl ether acetate (PGMEA); esters such as ethyl lactate; and ketones such as acetone, methyl ethyl ketone, cyclopentanone, cyclohexanone and cycloheptanone. Additionally, aromatic hydrocarbons such as toluene and xylene, acetonitrile, dimethylformamide, dioxane, etc. may also be used as the case demands.

As an etching gas to be used for dry-etching the anti-reflective coating, any one may be used that has conventionally been used for removing organic coatings. Generally, a mixed gas of chlorine gas ($CL_2$) and oxygen gas ($O_2$)

(hereinafter referred to as "chlorine-containing etching gas", a mixed gas of nitrogen gas ($N_2$) and oxygen gas ($O_2$) (hereinafter referred to as "nitrogen-containing etching gas", a mixed gas of sulfur dioxide gas ($SO_2$) and oxygen gas ($O_2$) (hereinafter referred to as "sulfur-containing etching gas", and the like are used. Etching properties of each etching gas are described below. The sulfur-containing etching gas is preferred since it does not involve the problem that an etchable layer 2 composed of polysilicon is etched and that dimensional variation and dimensional fluctuation of a pattern formed in the etchable layer become serious.

(Chlorine-containing Etching Gas)

The chlorine-containing etching gas has stronger ionic properties, i.e., stronger sputtering properties than the sulfur-containing etching gas. Hence, in a dry-etching step for the anti-reflective coating 12, deposition products formed by the etching gas and adhered on the side wall of the anti-reflective coating 12 less come off and adhere onto the upper surface of the anti-reflective coating 12, and the etching gas shows large activity of removing the reaction products formed in the interface between the anti-reflective coating and the radiation sensitive material coating. Therefore, the number of residues composed of the etchable layer is small, said residues being formed by the masking function of the deposition products or the reaction products. For example, when dry-etching of the anti-reflective coating 12 was conducted through a mask of patterned radiation sensitive material coating 13b using the chlorine-containing etching gas containing oxygen gas in the same flow ratio as in Example 1 to be described hereinafter, number of the residues was measured in the same manner as in Example 1 to find the number being about 5,000/wafer which was less than in Example 1. However, the chlorine-containing etching gas was found to cause dry-etching of the etchable layer 11 composed of polysilicon subsequent to the dry-etching of the anti-reflective coating 12. This is attributed to progress of reactive dry etching wherein silicon (Si) of polysilicon in the etchable layer 11 reacts with chlorine ($Cl_2$) to form $SiCl_4$. Thus, in the step of dry-etching the etchable layer 11, its areas having been dry-etched by the chlorine-containing gas undergo over-etching, and semiconductor substrate 10 which is not essentially intended to be etched might be etched. Therefore, though the chlorine-containing gas can reduce the number of the residues in comparison with the sulfur-containing gas, it also etches semiconductor substrate 10, thus yield of semiconductor integrated circuit devices being decreased.

(Nitrogen-containing etching gas)

The nitrogen-containing etching gas also has stronger ionic properties, i.e., stronger sputtering properties than the sulfur-containing etching gas. Hence, in a dry-etching step for the anti-reflective coating 12, deposition products formed by the etching gas less adhere to the side wall of the anti-reflective coating 12, and the etching gas shows large activity of removing the reaction products formed in the interface between the anti-reflective coating and the radiation sensitive material coating. Therefore, the number of residues composed of the etchable layer is small, said residues being formed by the masking function of the deposition products or the reaction products. For example, when dry etching of the anti-reflective coating 12 was conducted through a mask of patterned radiation sensitive material coating 13b using the chlorine-containing etching gas containing oxygen gas in the same flow ratio as in Example 1 to be described hereinafter, number of the residues was measured in the same manner as in Example 1 to find the number being about 5,000/wafer which was less than in Example 1. The phenomenon experienced with the chlorine-containing etching gas that the etchable layer 11 composed of polysilicon is etched did not take place.

However, in the step of dry-etching the anti-reflective coating 12, the patterned radiation sensitive material coating 13b is also seriously etched, and hence there arises a problem that patterned anti-reflective coating suffers serious dimensional variation and dimensional fluctuation. This is attributed to the fact that degree of adhesion, on the side wall of the radiation sensitive material coating 13b and the anti-reflective coating, of deposition products formed by the etching gas is less than the case of using the chlorine-containing etching gas. Therefore, in the etching step for forming a line pattern with 0.25-μm design rule, the sulfur-containing etching gas gives a pattern width of 0.23 μm with thinning by about 0.02 μm for the design rule and gives the same dimensional variation in isolated pattern area and in dense pattern area, whereas the nitrogen-containing etching gas gives a pattern width of 0.18 μm in an isolated pattern area and gives a pattern width of 0.20 μm in an area of 1:1 in line width:space width, thus giving a large dimensional variation for the design rule and a large dimensional variation between pattern in isolated pattern area and that in dense pattern area.

Accordingly, the nitrogen-containing etching gas has the problem that, though it can reduce the number of residues in comparison with the sulfur-containing etching gas, it gives large dimensional variation and fluctuation of the pattern composed of the etchable layer 11, thus yield of semiconductor integrated circuit devices being lowered.

(Sulfur-containing Etching Gas)

Although the sulfur-containing etching gas has the problem that it forms more residues on the semiconductor substrate 10 composed of the etchable layer 11 with the reaction products functioning as a mask, than the chlorine- or nitrogen-containing etching gas, it does not cause the problem that the semiconductor substrate 10 is also etched as with the chlorine-containing etching gas or that dimensional variation and dimensional fluctuation of the pattern of etchable layer become large as with the nitrogen-containing etching gas.

In addition, when the sulfone compound or the sulfonate compound is contained in the radiation sensitive material, production of the aromatic reaction products in the interface between the anti-reflective coating 12 and the radiation sensitive material coating 13 can be prevented as has been described hereinbefore. Hence, when a pattern composed of etchable layer 11 is formed, the number of residues composed of the etchable layer which are formed on the semiconductor substrate 10 can be reduced.

Accordingly, when dry etching of the etchable layer 11 is conducted using as a mask the patterned radiation sensitive material coating 13b containing the sulfone compound or the sulfonate compound and using the sulfur-containing etching gas, selectivity for the etchable layer to be etched 11 is improved, dimensional variation and dimensional fluctuation of the pattern of the etchable layer can be reduced, and the number of residues of the etchable layer formed on the semiconductor substrate 10 can be decreased.

BEST MODE FOR PRACTICING THE INVENTION

The present invention will be described more specifically by reference to Examples and Comparative Examples which, however, are not construed to limit the present invention in any way.

EXAMPLE 1

An etchable layer 11 composed of polysilicon was deposited on 200-mm diametrical semiconductor substrate 10 composed of silicon with silicon oxide layer intervening therebetween as an etching stopper. Then, an organic material of polysulfone copolymer dissolved in a solvent of cyclohexanone was applied on the etchable layer 11 to form an anti-reflective coating 12 having a thickness of 150 nm.

Subsequently, a resist solution, prepared by using 0.567 g of triphenylsulfonium trifl-ate, 3.0 g of biscyclohexylsulfonyl diazomethane, 7.9 g of a solution of 0.1 mmol/g of triphenylsulfonium acetate (TPSA) in propylene glycol monomethyl ether acetate (PGMEA) and 0.06 g of Megafac (surfactant made by Dainippon Ink and Chemicals, Incorporated: ingredient for improving filming properties upon coating resist and for improving affinity for a substrate) per 100 g of poly[p-(1-ethoxyethoxy) styrene-p-hydroxystyrene] and containing the solid components in a content of 15.5 wt % in PGMEA, was coated on the anti-reflective coating and baked on a direct hot plate at 90° C. for 60 seconds to form a 0.690-$\mu$m thick radiation sensitive material coating. This radiation sensitive material coating was selectively exposed through a mask using 248.4 nm KrF excimer laser light, subjected to post exposure baking (PEB) on a direct hot plate at 110° C. for 90 seconds, then paddle-developed for 60 seconds in an alkali developer solution (a 2.38 wt % aqueous solution of tetramethylammonium hydroxide (TMAH)) to obtain a positive, line-and-space pattern. Observation of line width and cross sectional profile of the positive pattern under a scanning type electronic microscope revealed that it was a pattern of 0.18 $\mu$m or less with good orthogonality at an exposure amount of 36.0 mJ/cm$^2$.

Then, the anti-reflective coating 12 was dry-etched with a mixed etching gas composed of sulfur dioxide gas (SO$_2$) and oxygen gas (O$_2$) through a mask of patterned radiation sensitive material coating 13b to thereby form a patterned anti-reflective coating. Further, the etchable layer 11 composed of polysilicon was dry-etched using a mixed etching gas composed of hydrogen bromide gas (HBr) and oxygen gas (O$_2$) through a mask of these patterned radiation sensitive material coating 13b and the anti-reflective coating to thereby form a pattern composed of the etchable layer 11. In this case, the pattern was formed by changing the space widths of wiring pattern having a design rule of 0.25 $\mu$m with a pattern percentage of about 5%. Number of the residues having sizes of about 50 nm or more was counted to be about 6000/wafer.

COMPARATIVE EXAMPLE 1

The same anti-reflective coating as in Example 1 was formed on the etchable layer composed of polysilicon and deposited on a semiconductor substrate, and there was formed the same radiation sensitive material coating as in Example 1 except for not containing biscyclohexylsulfonyl diazomethane. When a pattern composed of the etchable layer was formed under the same conditions as in Example 1, there were formed about 10000/wafer residues.

As can be seen from comparison of Example 1 with Comparative Example 1, the number of residues was decreased by about 40% in Example 1. As a result, leakage current between wiring patterns or between conductive layer and wiring pattern in the semiconductor integrated circuit device can be decreased by about 40%.

COMPARATIVE EXAMPLE 2

The same radiation sensitive material coating as in Example 1 was formed on the etchable layer composed of polysilicon and deposited on a semiconductor substrate without forming the anti-reflective coating. When a pattern composed of the etchable layer was formed under the same conditions as in Example 1, there were formed about 500/wafer residues.

Additionally, similar evaluation tests to that employed in Example 1 were conducted using, as organic materials for forming the anti-reflective coating, DUV-18, CD9, CD11 (all manufactured by Brewer Science Co.), AR2 (manufactured by Shipley Co.), SWK-EX2 (manufactured by Tokyo Oka Kogyo K.K.) to find formation of considerably larger number of residues in comparison with Comparative Example 2. It is seen from this that, when the anti-reflective coating is intervened between the etchable layer and the radiation sensitive material coating, an increase in number of the residues can not be avoided in comparison with the case where no anti-reflective coating is intervened.

EXAMPLE 2

In the same manner as in Example 1 except for using biscyclohexylsulfonyl methane in place of biscyclohexylsulfonyl diazomethane, there was formed an etched pattern. Number of the residues was about 8400/wafer, thus the number of the residues being decreased by about 16% in comparison with Comparative Example 1.

EXAMPLE 3

In the same manner as in Example 1 except for using bis(3-methylphenylsulfonyl) methane in place of biscyclohexylsulfonyl diazomethane, there was formed an etched pattern. Number of the residues was about 6000/wafer, thus the number of the residues being decreased by about 40% in comparison with Comparative Example 1.

EXAMPLE 4

In the same manner as in Example 1 except for using 1.0 g of bis(3-methylphenylsulfonyl) diazomethane in place of biscyclohexylsulfonyl diazomethane, there was formed an etched pattern. Number of the residues was about 4600/wafer, thus the number of the residues being decreased by about 64% in comparison with Comparative Example 1.

EXAMPLE 5

In the same manner as in Example 1 except for using 1.0 g of the compound shown by the following formula in place of biscyclohexylsulfonyl diazomethane, there was formed an etched pattern. Number of the residues was about 6000/wafer, thus the number of the residues being decreased by about 40% in comparison with Comparative Example 1.

EXAMPLE 6

In the same manner as in Example 1 except for using 1.0 g of pyrogallol trismethanesulf onate in place of biscyclohexylsulfonyl diazomethane, there was formed an etched pattern. Number of the residues was about 4500/wafer, thus the number of the residues being decreased by about 55% in comparison with Comparative Example 1. Additionally, in the above-described embodiments of the present invention and Examples, etc., only the anti-reflective coating 12 was dry-etched upon dry-etching the anti-reflective coating 12, and it was not conducted to simultaneously dry-etch the underlying etchable layer 11. In this method, if dimensional variation or an increase in the amount of residues or foreign matters is confirmed due to trouble in the step of dry-etching the ant-reflective coating 12, the procedures may be made once more from the step of applying the anti-reflective coating after removing the radiation sensitive material 13 and the anti-reflective coating 12. Therefore, there is the advantage that, when pattern formation is conducted with checking wafer properties after the completion of each step, formation of bad wafers can be prevented. However, the dry-etching step in accordance with the present invention is not limited only to dry etching only the anti-reflective coating as described above, but it includes the method of dry-etching, for example, both the anti-reflective coating 12 and the etchable layer 11 in one and the same dry etching step. The dry-etching method of dry-etching both the anti-reflective coating 12 and the etchable layer 11 in one and the same dry etching step gives a great advantage of shortening the steps. This method is also one useful method of forming a pattern according to the present invention.

Advantages of the Invention

According to the method of forming a pattern in accordance with the present invention, when the radiation sensitive material coating which contains the sulfone compound and/or the sulfonate compound is selectively exposed to energy beams, aromatic acids released from these compounds effectively suppress radical reaction in the interface between the anti-reflective coating and the radiation sensitive material coating, thus formation of aromatic, reaction products being prevented in the interface. Hence, when the etchable layer is dry-etched using the patterned radiation sensitive material coating and anti-reflective coating as a mask to form a pattern composed of the etchable layer, number of the residues formed on a semiconductor substrate and composed of the etchable layer can be decreased.

Thus, when the etchable layer is a conductive layer, the method of forming a pattern in accordance with the present invention can effectively prevent electrical leakage between wiring patterns or between conductive layer and wiring pattern in a semiconductor integrated circuit device wherein wiring patterns are formed on the same conductive layer which might be electrically connected to each other through conductive residues or wherein a conductive layer and a wiring pattern formed on a semiconductor substrate might be electrically connected to each other through conductive residues, thus deterioration of the properties of resulting semiconductor integrated circuit device being surely prevented.

In addition, since the onium salt compound and the sulfone compound and/or the sulfonate compound are contained as acid generators in the radiation sensitive material, there can be obtained a highly resolved resist pattern having no standing wave effect, not suffering formation of T-top, and having no difference between line width of resist pattern in isolated pattern area and that in dense pattern area, leading to formation of a highly resolved etched pattern having line width as designed.

In addition, in the method of forming a pattern in accordance with the present invention, if the fourth step involves a step of dry-etching the anti-reflective coating by the sulfur-containing etching gas using the patterned radiation sensitive material coating as a mask, selectivity of etching the etchable layer can be improved, dimensional variation and dimensional fluctuation of the pattern composed of the etchable layer can be reduced, and number of the residues formed on the semiconductor substrate and composed of the etchable layer can be decreased.

Industrial Utility

As has been described hereinbefore, the method of forming a pattern in accordance with the present invention is useful as a method for forming a fine pattern for manufacturing semiconductor integrated circuit devices.

What is claimed is:

1. A method of forming a pattern comprising: a first step of forming an anti-reflective coating which is made of organic materials and absorbs energy beams, on an etchable layer which is formed on a substrate for semiconductor; a second step of forming a radiation sensitive material coating on the anti-reflective coating; a third step of exposing the radiation sensitive material coating with energy beam selectively and then removing the exposed or non-exposed areas of the radiation sensitive material coating to form a pattern of the radiation sensitive material coating; and a fourth step of dry-etching the etchable layer using as a mask the pattern of the radiation sensitive material coating to form a pattern composed of the etchable layer, wherein the radiation sensitive material coating is made from a chemically amplified resist comprising (a) a resin which is alkali-insoluble or slightly alkali-soluble and comprises a substituent or substituents capable of being released in the presence of an acid and (b) compounds generating an acid upon exposure to radiation which comprise at least one onium salt and at least one sulfone compound.

2. A method of forming a pattern according to claim 1, wherein the fourth step involves a step of dry-etching the anti-reflective coating with a sulfur-containing etching gas and by using as a mack the pattern of radiation-sensitive material coating to form a pattern of the anti-reflective coating and then dry-etching the etchable layer using as a mask the pattern of the radiation sensitive material coating and the anti-reflective coating to form a pattern of the etchable layer.

3. The method of forming a pattern according to claim 2, where the etching gas comprises sulfur dioxide and oxygen.

4. The method of forming a pattern according to claim 1, where the onium salt is selected from a sulfonium salt, a iodonium salt, a phosphonium salt, a diazonium salt, and a pyrdinium salt.

5. The method of forming a pattern according to claim 1, where the sulfone compound is selected from bissulfonylmethane, bissulfonyidiazomethane, sulfonylcarbonyidiazomethane, and sulfonylcarbonylalkane.

* * * * *